United States Patent [19]
Easter

[11] 4,086,579
[45] Apr. 25, 1978

[54] VIDEO DIGITAL DISPLAY DEVICE WITH ANALOG INPUT

[75] Inventor: Finis Claude Easter, Canoga Park, Calif.

[73] Assignee: RCA Corporation, New York, N.Y.

[21] Appl. No.: 721,980

[22] Filed: Sep. 10, 1976

[51] Int. Cl.² .................. G06K 15/20; H03K 13/02
[52] U.S. Cl. .......................... 340/324 AD; 315/378; 315/383; 340/347 AD
[58] Field of Search ............ 340/324 AD, 347 AD; 358/13, 141; 315/378, 386, 383, 385; 343/17

[56] References Cited

U.S. PATENT DOCUMENTS

| | | | |
|---|---|---|---|
| 2,227,630 | 1/1941 | Carnahan | 315/383 X |
| 2,416,199 | 2/1947 | Nagel | 315/378 |
| 3,142,056 | 7/1964 | Martin et al. | 340/347 AD |
| 3,720,859 | 3/1973 | Hilden | 315/383 X |
| 3,964,064 | 6/1976 | Brandau et al. | 343/17 |

*Primary Examiner*—David L. Trafton
*Attorney, Agent, or Firm*—H. Christoffersen; Joseph D. Lazar; Raymond E. Smiley

[57] ABSTRACT

An analog-to-digital converter includes a common input amplifying device such as a transistor in differential amplifier relationship with each of a plurality of output amplifying devices, one for each voltage range converted to digital form.

Separately controllable circuits are provided for: (A) setting a video display screen signal to the threshold of visibility, and (B) increasing the brightness of the screen to various levels above the threshold in accordance with digital signals from the analog-to-digital converter as modified by a brightness control.

13 Claims, 6 Drawing Figures

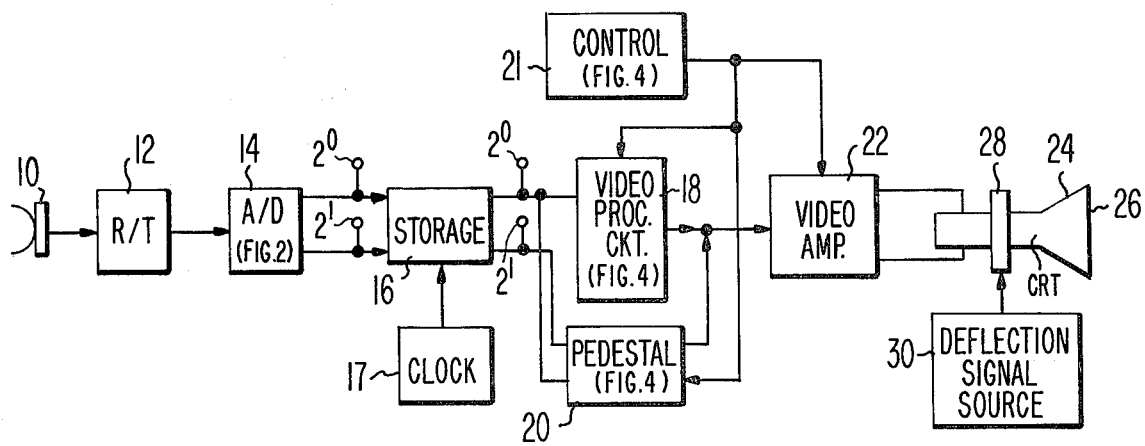
Fig.1
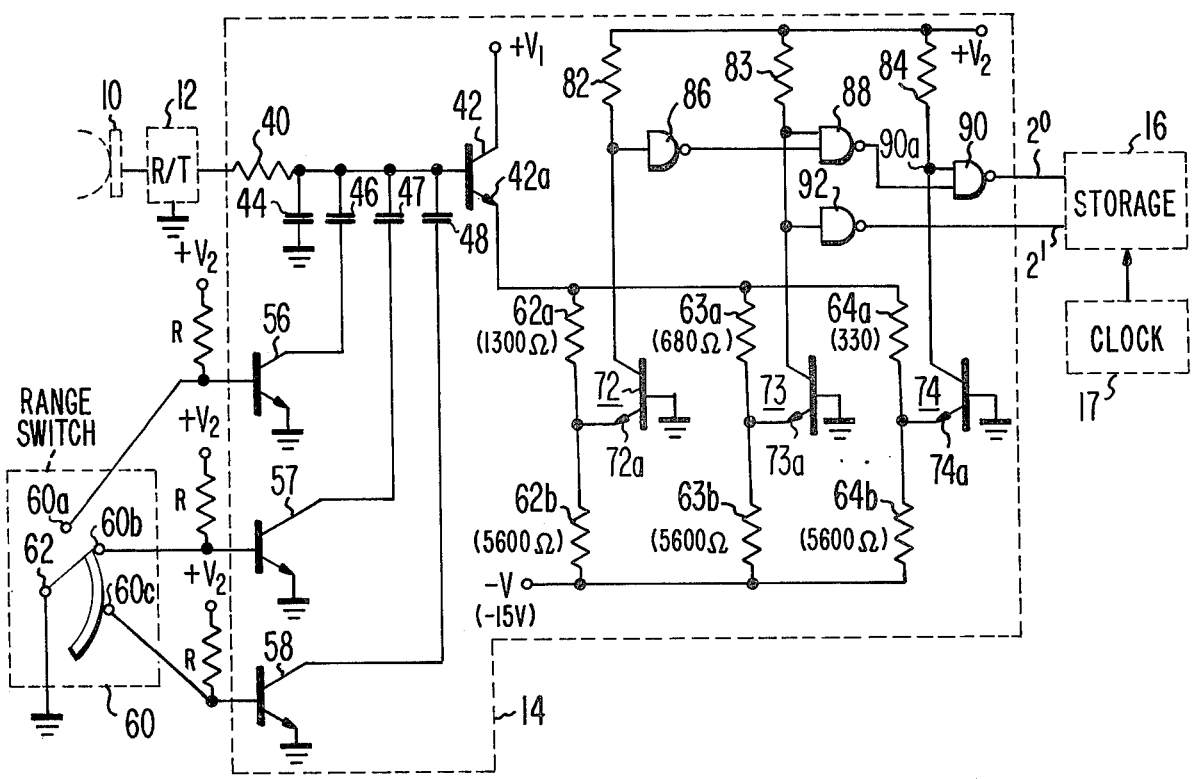
Fig.2
| LEVEL | TRANSISTOR COLLECTOR | | | OUTPUT | |
|---|---|---|---|---|---|
| | 72 | 73 | 74 | $2^1$(92) | $2^0$(90) |
| 0 | 0 | 0 | 0 | 1 | 1 |
| 1 | 0 | 0 | 1 | 1 | 0 |
| 2 | 0 | 1 | 1 | 0 | 1 |
| 3 | 1 | 1 | 1 | 0 | 0 |
Fig.3

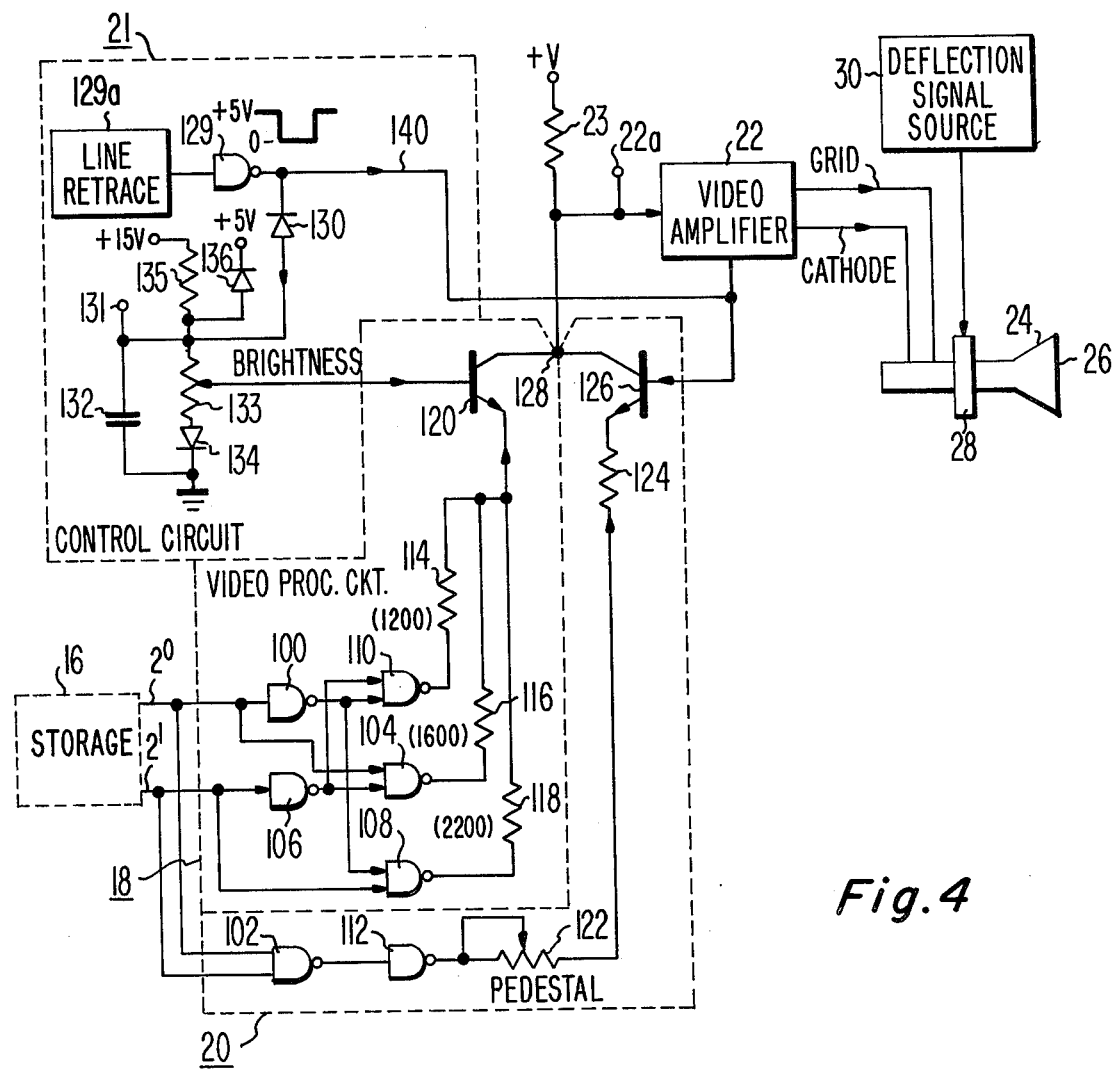
Fig.4
| LEVEL | 2¹ | 2⁰ | 112 | 108 | 104 | 110 | |
|---|---|---|---|---|---|---|---|
| 0 | 1 | 1 | 1 | 1 | 1 | 1 | DARK DISPLAY |
| 1 | 1 | 0 | 0 | 0 | 1 | 1 | |
| 2 | 0 | 1 | 0 | 1 | 0 | 1 | |
| 3 | 0 | 0 | 0 | 1 | 1 | 0 | BRIGHTEST DISPLAY |
Fig.5
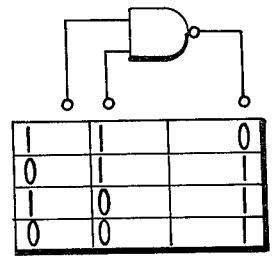
Fig.6

4,086,579

VIDEO DIGITAL DISPLAY DEVICE WITH ANALOG INPUT

BACKGROUND OF THE INVENTION

A widely used form of analog-to-digital converter utilizes a plurality of differential amplifier circuits, each referenced to a different voltage within the range of the analog voltage input. See for example U.S. Pat. No. 3,964,064 issued June 15, 1976, to R. L. Brandao, et al. As each differential amplifier involves two transistors or other amplifying devices with associated circuitry, the cost of such an analog-to-digital converter is relatively expensive.

Analog-to-digital converters are used in video display devices which display different levels of brightness depending on the output of the converter. Typically one of the levels to be displaced is manifested as a dark screen. In some prior art systems the display drive circuitry is permanently clamped at an ideal threshold of visibility, that is, a point at which the screen is on the borderline between darkness and minimal brightness. It is then altered by the output from the analog-to-digital converter for different levels of brightness. Unfortunately the display device may not in reality be set precisely to the threshold of visibility due to, for example, changes in environmental conditions. As a result desirably dark portions of the screen may appear undesirably at some level of brightness.

An alternative prior art solution consists of setting the drive signal threshold well below the threshold of visibility. Then appropriate signals from the analog-to-digital converter cause various brightness levels to appear on the screen including truly dark areas. Such a system appears to be an improvement over the previously mentioned system which is set at the threshold of visibility, but the improvement is not found to exist in practice due to the presence of a brightness control for setting the overall brightness as desired by the viewer. As the brightness control is adjusted to raise the brightness level sufficiently above some average value, the brightest portions of the display reach some upper limit and desirably lesser brightness areas become undesirably as bright as the brightest areas. Also when the brightness control is adjusted to lower brightness level sufficiently below the average level, minimal brightness areas on the screen undesirably merge with the dark areas. That is, with the brightness control set sufficiently above or below some average value available resolution is lost in the presentation.

SUMMARY OF THE INVENTION

An analog-to-digital converter is responsive to an input signal which, as a function of time, varies over a range of values for producing time-spaced discrete output signals in accordance with the value of the input signal. The converter comprises a sole input amplifying device coupled to receive the input signal. A plurality of output devices are coupled to the input amplifying device in differential amplifying relationship.

A video display device is receptive of an input signal at various values which may come from the analog-to-digital converter for correspondingly displaying related levels of brightness on related portions of the screen. The screen includes at least a dark portion. The display device comprises means normally setting said input signal to a value corresponding to a screen level below the threshold of visibility. The display device further comprises means responsive to the input signal being at a value corresponding to any level of brightness on the screen for producing a first signal which will cause the screen to rise to the threshold of visibility and for producing a second signal which when summed with the first signal will cause the screen to be at a brightness level which is a function of the value of the input signal. A summing means is included responsive to the first and second signal for applying the summed signal to the display screen causing appropriate portions of the screen to display vaious levels of brightness only when an input signal corresponding to some brightness level is present, other portions of the screen being dark.

BRIEF DESCRIPTION OF THE DRAWING

FIG. 1 is a digital weather radar in block diagram form embodying the present invention.

FIG. 2 is a preferred embodiment of an analog-to-digital converter in accordance with the invention as employed with the radar of FIG. 1.

FIG. 3 is a table of logic levels relating to a portion of the circuit of FIG. 2.

FIG. 4 is a preferred embodiment of a video processing circuit and related circuits in accordance with the invention as employed with the radar of FIG. 1.

FIG. 5 is a table of logic levels related to a portion of the circuit of FIG. 4; and FIG. 6 is a truth table for a logic element employed in FIGS. 2 and 4.

DETAILED DESCRIPTION OF A PREFERRED EMBODIMENT

Referring to FIG. 1 a digital weather radar in block diagram form is illustrated. A transmitting and receiving antenna 10 of conventional design is coupled to the input of a conventional radar receiver-transmitter (RT) 12 which is referenced to a source of reference potential such as ground. The analog output signal generated by RT 12 is coupled to the input terminal of an analog-to-digital converter (A/D) 14 which converts the analog voltage input signals into a plurality of successive digital signals in binary form. As illustrated A/D 14 produces a two bit binary code which therefore represents four distinct voltage levels. A/D 14 is described in more detail in connection with the description of FIG. 2.

A/D 14 is coupled to the input terminals of a storage device 16. Storage device 16 includes a memory such as a core memory, solid state memory, or if desired a delay line for storing a plurality of digits in binary form. It also includes the necessary control and timing circuits for the type of memory utilized. A clock circuit 17 is also coupled to storage device 16 to control the timing of input signals thereto. The output terminals of storage device 16 are coupled to a video processing circuit 18 and to a pedestal circuitry 20 both of which are described in more detail in connection with the description of FIG. 4. The output terminals of video processing circuit 18 and of pedestal circuit 20 are coupled to a common input terminal of video amplifier 22. A control circuit also detailed in FIG. 4 is coupled to control input terminals of video processing circuit 18, pedestal circuit 20 and video amplifier 22. The output terminal of video amplifier 22 is coupled to a visual display device schematically illustrated as a cathode ray tube (CRT) 24, for purposes of displaying on different parts of screen face 26 varying light levels corresponding to signals received at antenna 10.

CRT 24 typically includes suitable electron beam deflection circuitry 28 coupled to and controlled by a source of deflection signals 30 which being known to those skilled in the art need not be further described.

A preferred embodiment of an analog-to-digital converter is illustrated in FIG. 2 to which attention is now directed. RT 12 (the same device illustrated in FIG. 1) is resistively coupled through resistor 40 to the base of an amplifying device such as transistor 42 arranged to have a high impedance input and a low impedance output. Also coupled to transistor 42 are respective terminals of a plurality of capacitors 44, 46, 47 and 48. The other terminal of capacitor 44 is coupled to a source of reference potential such as ground while the respective second terminals of capacitors 46, 47 and 48 are coupled to collectors of open collector transistors 56, 57 and 58 respectively.

The emitters of the transistors 56–58 are coupled to a common source of reference potential such as ground while the bases are coupled to respective contacts 60a, b and c of a range switch 60 and coupled through bias resistors R to a convenient source of potential such as $+V_2$. The common contact 62, which is a shorting contact of the range switch 60, is coupled to a source of reference potential such as ground.

The collector of transistor 42 is coupled to a source of reference potential $+V_1$ which has a value in excess of the maximum voltage present at the output terminal of RT 12. The emitter of transistor 42 is coupled in common to one end terminal of each of three resistive potential divider networks comprising resistors 62a–62b, 63a–63b, 64a–64b each dividing by different factors. Numbers in parenthesis beneath the resistor legends are resistor values in one exemplary device. The other end terminal of each of the divider networks is coupled to a common source of potential $-V$ which is negative relative to the potentials expected at emitter 42a. An exemplary value of voltage $-V$ is given in parenthesis. It will of course be appreciated that the polarities of $-V$, $+V$, and of transistor 42 are arbitrarily chosen and may be reversed in an appropriate situation. The common terminal of resistors 62a and 62b are coupled to one electrode of the principal conductive path such as the emitter terminal of a transistor means 72 while the emitter terminals of transistor means 73 and 74 are similarly coupled to common terminals of the other two networks. It will be appreciated that although bipolar transistors are illustrated in FIG. 2, other types of amplifying devices such as field effect transistors may be advantageously employed. The control electrodes or bases of all three transistors 72–74 are connected in common to a source of reference potential such as ground. The second electrodes of the principal conductive paths such as the collectors of the three transistors 72–74 are coupled respectively to one input terminal of each of bias resistors 82, 83 and 84. The resistors are coupled to a source of potential $+V_2$.

The collector of transistor 72 is also coupled to the input terminal of an inverter or NAND gate 86. The output terminal of NAND gate 86 and the collector of transistor 73 are coupled respectively to input terminals of NAND gate 88. The output terminal of NAND gate 88 and the collector of transistor 74 are coupled to respective input terminals of a NAND gate 90. The output terminal of NAND gate 90 is coupled to the $2^0$ input terminal of storage device 16. The collector of transistor 73 is coupled to the input terminal of an inverter of NAND gate 92, the output terminal of which is coupled to the $2^1$ input terminal of storage device 16. A source of clock pulses 17 is also coupled to storage device 16 for the purpose of periodically gating in digital information signals on the $2^0 + 2^1$ lines. Although not shown the rate of clock 17 is also controlled by range switch 60 producing pulses at a relatively low rate for a setting of switch 60 indicative of a large maximum range and producing pulses at a relatively high rate for a setting indicative of a short maximum range. The frequency of clock 17 is adjusted such that for any given maximum range it produces a given number of pulses in the time required for a radar return signal to reach antenna 10 (FIG. 1) from that maximum range. The interconnection of the elements of FIG. 2 is such that transistor 42 forms a differential amplifier with each of the three transistors 72, 73 and 74 eliminating, in effect, two additional transistors that would be required with three conventional differential amplifiers.

Operation of the circuit of FIG. 2 will be described in connection with reference to the table of FIG. 3. As mentioned above, exemplary resistor and voltage values are given in parentheses for certain of the elements in FIG. 2. Actual values for any given system will depend on the nature of signals from the input device and desired threshold values for each of the four digital signal levels. Switch 60 is set by an operator to a position dependent on the range desired to be displayed.

The arrangement of switch 60 and associated components is such that, when the common contact 62 is not making electrical connection with a contact 60a, 60b or 60c connected to a transistor emitter, that transistor is biased to conduction effectively clamping the associated one of capacitors 46–48 to ground. When the common contact 62 is making electrical connection with a contact 60a, 60b or 60c connected to a transistor, the transistor is biased "off" and the associated capacitor is effectively disconnected. Range switch 60 while functionally part of A/D 14 is physically located on a display console (not shown) for ease of manipulation by an operator.

The purpose of the range switch 60, which is suitably a multipole switch, only one pole of which being shown, is to set the maximum range displayed by the radar. Since the radar stores and displays a given number of digits of information irrespective of the maximum range, the period between successive digits is a direct function of the range. Therefore the values of capacitors 46, 47 and 48 are chosen such that the time constant resulting from the combination of capacitors and resistor 40 provides proper integration of the signal supplied to the base of transistor 42 from RT 12 at each range. The purpose of capacitor 44 is to provide proper integration at the shortest range when capacitors 46–48 are out of the circuit due to grounding of contacts 60a, 60b and 60c. As contact 62 is rotated clockwise for increasing range, first capacitor 46 is grounded placing it, in effect, in parallel with capacitor 44 providing an increased resistor-capacitor time constant than with capacitor 44 alone. After switch 60 is set as desired, RT 12 generates a pulse, termed a "main bang," which is transmitted by antenna 10. Return signals are amplified by RT 12, integrated by the appropriate resistor capacitor combination, depending on the setting of range switch 60 as discussed above, and applied to transistor 42.

The voltage appearing at the emitter 42a of transistor 42 will vary in accordance with the related signal level. Transistors 72, 73 and 74 are arranged to respond respectively to different threshold values of voltage in the emitter 42a. In this embodiment transistor 74 responds to the lower values, transistor 73 to intermediate values, and transistor 72 to relatively high values.

At low signal levels at emitter 42a (arbitrarily termed "level 0") which will be displayed as dark portions on screen face 26, (FIG. 1), all of transistors 72, 73 and 74 are conducting resulting in their emitters 72a, 73a and 74a respectively being essentially at ground. This assumption ignores the voltage drop between the base and emitter of each of transistors 72, 73 and 74. When transistors 72, 73 and 74 are conducting, each of their respective collectors is essentially at zero volts or ground which corresponds to a logic level "0". In accordance with the table of FIG. 3 when the input voltage at each of NAND gates 86, 88, 90 and 92 is zero (determined by the collector voltage at each of the associated transistors 72, 73 and 74), the output of NAND gate 90 and 92 will be at logic level "1". When a transistor 72, 73 or 74 is conducting and its emitter is therefore at ground, a current, I, is established in its associated resistor 62b, 63b or 64b. For the exemplary resistance and −V voltage values given in FIG. 2, the current, I, is 2.7 ma. computed by dividing the voltage drop (15 volts) across each of the resistors by the resistance value (5600 ohms).

As the signal level at the base of transistor 42 and therefore at emitter 42a begins to rise, current in each of resistors 62a, 63a and 64a also rises. When the current between emitter 42a and any one of emitters 72a, 73a or 74a reaches the same value as the current between any of emitters 72a, 73a or 74a and −V, current between the base and emitter of the transistor ceases and the transistor becomes non-conducting. For the exemplary component and voltage values in FIG. 2 conduction of a transistor 72, 73 or 74 ceases when a current of 2.7 ma. is present in its associated resistor 62a, 63a or 64a. A current of 2.7 ma. will occur in transistor 64a when emitter 42a is at 0.9 volts which is computed by multiplying the value of resistor 64a (330 ohms) by the 2.7 ma. desired current flow. Said in another way when signal returns to antenna 10 are such that 0.9 volts (or more) is present at emitter 42a transistor 74 is made nonconductive. When transistor 74 is nonconductive its associated collector resistor 84 in conjunction with the voltage $+V_2$ causes a positive voltage, termed a logic level "1", to be applied to terminal 90a of NAND gate 90. From the table, FIG. 3, as shown in the row "level 1", it will be noted that the resulting $2^1$ and $2^0$ outputs are logic levels "1" and "0", respectively, which will be stored in successive locations in storage device 16 at each clock pulse from clock source 17.

In a manner similar to that just described, at higher voltage values at emitter 42a, transistor 73 becomes nonconductive while transistor 74 remains nonconductive. At still higher voltage values at emitter 42a, transistor 72 becomes nonconductive while transistors 73 and 74 remain nonconductive. For the exemplary component values from FIG. 2, transistor 73 becomes nonconductive when emitter 42a is at 1.8 volts while transistor 72 becomes nonconductive when emitter 42a is at 3.6 volts. FIG. 3 details the resultant output on the $2^0$ and $2^1$ lines which are stored in storage device 16. As mentioned previously, in the absence of the circuit of FIG. 2 just described, a pair of transistors arranged in differential amplifier relationship would be required for each different level of digital output required. No circuitry is required for the lowest or zero level. According to the present invention three different levels of input signals can be identified, not with six transistors, but with only four transistors. With more desired levels the need for even more transistors, as would be required in the prior art, is avoided as only one input transistor, 42, is needed regardless of the number of different output levels.

Once the digital values in binary form corresponding to returns at antenna 10 are stored in storage device 16 they must be converted to a form suitable for display on CRT 24. This conversion is accomplished in the circuit of FIG. 4 to which attention is now directed.

The $2^0$ output terminal of storage device 16 (FIGS. 1 and 2) is coupled to respective input terminals of NAND gates 100 and 104 in a video processing circuit 18. The $2^1$ output terminal of storage device 16 is coupled to respective input terminals of NAND gates 106 and 108. The output terminal of NAND gate 100 is coupled to an input terminal of NAND gate 110 and to a second input terminal of NAND gate 108. The output terminal of NAND gate 106 is coupled to a second input terminal respectively of NAND gates 104 and 110. The output terminals of NAND gates 110, 104 and 108 are coupled to respective terminals of resistors 114, 116 and 118. The other terminals of each of resistors 114, 116 and 118 are coupled in common to the emitter of a transistor 120.

The $2^0$ and $2^1$ outputs from storage device 16 are coupled to respective input terminals of a NAND gate 102 which is part of a pedestal circuit 20. The output terminal of NAND gate 102 is coupled to the input terminal of a NAND gate 112. NAND gate 112 is coupled to an end terminal and a center tap terminal of an adjustable resistor or potentiometer 122. The other end terminal of potentiometer 122 is coupled through a current limiting resistor 124 to the emitter of a second transistor 126. The collectors of transistors 120 and 126 are coupled to a summing node 128 for additively mixing the signals appearing at the collectors thereof. It will be appreciated that although bipolar transistors 120 and 126 are illustrated, other types, such as field effect transistors, could be utilized. The only limitation is that output signals therefrom be capable of being additively mixed at node 128 and that the input signals to device 120 be capable of being scaled as will be described. Node 128 and a resistor 23 are coupled to the input terminal 22a of video amplifier 22 (FIG. 1). The output terminals of video amplifier 22 are coupled to the grid and cathode terminals respectively of CRT 24.

Video amplifier 22 is of the type which is responsive to various current values at its input terminal for creating inversely corresponding voltage differentials between the grid and cathode of CRT 24. That is, the greater the current into amplifier 22 of terminal 22a, the lower the grid-cathode output voltage from the amplifier. The nature of CRT 24 is such that a relatively greater voltage differential between the grid and cathode is manifested as a relatively darker indication on screen surface 26 while a relatively smaller voltage differential is manifested as a relatively brighter indication. The purpose of resistor 23 is to ensure that, in the absence of current flow in transistors 120 and 126, video amplifier 22 is held such that CRT 24 exhibits a dark screen.

In the upper left corner of FIG. 4 a line retrace source 129a is coupled to the input terminal of a NAND gate 129. The output terminal of NAND gate 129 is coupled to a control input terminal of video amplifier 22, to the base of transistor 126 and to the cathode of a blocking diode 130. The anode of diode 130 is coupled to a terminal 131 to which are also connected an integration capacitor 132, one end terminal of a potentiometer 133, a bias resistor 135 and the anode of a diode 136. The outer end terminal of potentiometer 133 is coupled to the anode terminal of a temperature compensating diode 134 while the adjustable tap of the potentiometer is coupled to the base of transistor 120 for purposes of scaling the signal appearing at the emitter thereof. The cathode of diode 134 and the second terminal of capacitor 132 are coupled to ground. A source of potential, such as +15 volts, is connected to resistor 135. The cathode terminal of diode 136 is coupled to a source of potential of the same value as the logic level "1" for the various NAND gates, for example, +5 volts. Potentiometer 133 is part of a brightness control, is typically located on an operator's panel (not shown) of the radar device and is for use in setting the overall brightness of the display.

The operation of the circuit of FIG. 4 will be described in conjunction with FIGS. 5 and 6. The arrows on various ones of the conductors, such as arrow 140 near the upper left corner of FIG. 4, indicate signal flow direction and do not necessarily represent current or electron flow. Storage device 16 is assumed to contain in digital form at least one frame of information to be displayed on CRT 24.

In accordance with the invention a "pedestal" circuit 20 is provided consisting of NAND gates 102 and 112, potentiometer 122, resistor 124 and transistor 126. A factory adjustment is made in the following manner. For adjustment purposes the output terminal of NAND gate 112 is forced to a logic level "0" which is ground. Also line retrace 129a is forced to a logic level "0" so that the output terminal of NAND gate 129 is at logic level "1" or (by way of example) +5 volts causing transistor 126 to operate as an amplifier. Further, each of NAND gates 104, 108 and 110 are forced to logic level "1." As a result transistor 120 is nonconducting since its base can be no greater than the voltage at the output of NAND gate 129 which is also a logic level "1." Then potentiometer 122 is adjusted to provide emitter current flow in transistor 126 such that, in the absence of current flow in transistor 120, video amplifier 22 produces a grid-cathode voltage differential of such magnitude to bring CRT 24 to the threshold of visual perception. The threshold of visual perception is defined such that, below it, the human eye perceives screen darkness while, above it, the human eye perceives a minimum level of brightness on the screen face 26. With potentiometer 122 properly adjusted, operation of the circuit of FIG. 4 is as follows.

Assume first that storage device 16 is producing a level 0 signal (logic levels "1" at both its $2^0$ and $2^1$ output terminals.) From the table of FIG. 5 it will be noted that this condition corresponds to a dark display. Also from the table it will be noted that NAND gate 112 produces a logic level "1" (+5 volts for example). Line retrace is normally at logic level "0" and therefore NAND gate 129 is producing a logic level "1" signal which is applied to the base of transistor 126. As there is no base-emitter voltage differential on transistor 126 it is nonconducting. Since transistor 126 is nonconducting there is no emitter-collector current flow and no current at node 128 from pedestal circuit 18. Also with the $2^1$ and $2^0$ outputs of storage device 16 both at logic level "1" NAND gates 104, 108 and 110 are all at logic level "1" (+5 volts) as summarized in FIG. 5. The base of transistor 120 is at most at +5 volts depending on the setting of the brightness control potentiometer 133. Therefore, transistor 120 is also nonconducting because of its polarity type. As a result there is no current flow at node 128 and therefore no current flow to video amplifier 22. The resultant grid cathode voltage is at some maximum value, and the portion of the screen is dark where the electron beam is directed.

If storage device 16 produces a level 1 signal (logic levels "0" and "1") at the $2^0$ and $2^1$ terminals respectively, which corresponds to the lowest visible level on CRT 24, NAND gates 112 and 108 are at logic level "0" or ground while NAND gates 104 and 110 remain at logic level "1". The ground at NAND gate 112 combined with a logic "1" signal of the base of transistor 126 from gate 129 causes emitter current flow in transistor 126 of such magnitude that CRT 24 is driven to the threshold of visibility. Further, since NAND gate 108 is at logic level "0" or ground (see table, FIG. 5) resistor 118 is grounded. Also the base of transistor 120 is at some positive voltage dependent on the setting of brightness of potentiometer 133. Therefore emitter current flow occurs in transistor 120. The amount of current flow is dependent on three factors:
(1) the setting of the center tap of brightness potentiometer 133, (2) the value of the voltage at terminal 131 and (3) the value of resistance in the path between the emitter of transistor 120 and ground. For the moment, it will be assumed that capacitor 132 is fully charged such that terminal 131 is at +5 volts. Therefore the value of current at node 128 contributed by the transistor 120 circuitry for a given setting of brightness potentiometer 133 is dependent on which one of resistors 114, 116 or 118 is grounded. The logic in video processing circuit 18 is such that only one of the three resistors 114, 116, 118 is grounded at any time. Typical resistor values are given in parenthesis beneath the resistor legend numbers. It will be noted that resistor 118 has the highest value of the three and therefore when its associated NAND gate is at logic level "0" or ground, the lowest current will flow to node 128. It will be recalled that a relatively lower current results in a relatively high grid-cathode voltage which results in a relatively low brightness on CRT screen 26. Whenever storage device 16 produces logic levels "1" and "0" respectively at its $2^0$ and $2^1$ terminals (FIG. 5, level 2) NAND gate 112 remains at logic level "0" or ground while NAND gate 104 is also at logic level "0" or ground. With NAND gate 104 at ground current is caused to flow through resisting 116 causing an intermediate level of brightness to appear on CRT 24. Whenever storage device 16 produces logic level "0" at each of its output terminals (FIG. 5, level 3) NAND gate 112 remains at logic level "0" while NAND gate 110 is also at logic level "0". Therefore resistor 114 the lowest value of the three resistors 114, 116 and 118 is grounded resulting in maximum current flow at node 128 and therefore the brightest display on CRT 24. It will be noted that, as illustrated in FIG. 4, NAND gates 104, 108 and 110 are mutually exclusive. In the situation in which the value of resistor 114 is equal to the value of the parallel combination of resistors 116 and 118 the brightest or level 3 display may be acheived merely by setting the output terminals of NAND gates 104 and 108 to logic level "0" and eliminating gate 110.

After the video beam in CRT 24 has traced a line of information, typically consisting of some dark areas and areas of various levels of brightness depending on which of NAND gates 104, 108 or 110 is at logic level "0" at any particular point of beam deflection, the beam will reach the screen edge and a line retrace signal will be produced by line retrace circuitry 129a.

The resulting logic level "0" signal at the output terminal of NAND gate 129 is applied to video amplifier 22 causing grid cathode voltage such that CRT 24 beam electron flow is completely cut off. Also transistor 126 is made nonconductive since with the base at ground and the emitter at either ground or some positive value (assuming an NPN type transistor) no emitter current flow can occur. Further, since terminal 131 is clamped to ground discharging capacitor 132 and placing a ground on the base of transistor 120, no current can flow through that transistor for the same reason no current can flow through transistor 126. When the line retrace signal returns to logic level "0" and therefore the output terminal of NAND gate 129 returns to logic level "1" or +5 volts, capacitor 132 begins to charge and thus the voltage at terminal 131 begins to rise toward +5 volts. The resultant effect at CRT 24 with conduction through a given one of resistors 114, 116 and 118 is a scan line with relatively minimum brightness at the origin and relatively maximum brightness at the terminus just before the next line retrace begins.

In a standard weather radar with rho-theta presentation successive scan lines extend from a common origin radially outward at successive angles. Thus, in the absence of capacitor 132, the portions of the display lines near the origin which are crowded together and are therefore unduly bright obscuring the actual information to be displayed. In a video display with separate scan lines such as video terminals and some weather radar units the automatic brightness control feature is not needed since line crowding does not occur and therefore capacitor 132 is eliminated.

By providing, in accordance with the instant invention, a pedestal which is separate and distinct from the data signals and brightness control, the plurality of line levels on the screen are visually distinct regardless of the setting of the brightness control. In prior art systems at a relatively high brightness setting the lower brightness values merge into the higher values while at relatively low brightness control settings the lower brightness levels appear dark. In contrast to the prior art, in accordance with the present invention, because of the separately provided for pedestal at relatively bright or relatively low brightness settings all brightness levels on the CRT screen face 26 appear visible and distinct.

What is claimed is:

1. An analog-to-digital converter responsive to an input signal from an input signal source which, as a function of time, varies over a range of values for producing time spaced discrete output signals in accordance with the value of said input signal within said range comprising in combination:
   a sole input amplifying device having an input terminal coupled to receive said input signal and an output terminal;
   a plurality, X, of resistive potential divider networks dividing by different factors, each having a pair of input terminals and an output terminal, one input terminal of which is coupled to said output terminal of said amplifying device; the other input terminal of which is coupled to a common source of potential; and
   a like plurality, X, of transistor means each having a principal conductive path between first and second electrodes, the conductivity of which is controlled responsive to potential appearing between said first electrode and a control electrode, said first electrode being connected to an output terminal of a respective one of said potential divider networks, said control electrodes being connected to a common source of potential, signals at said respective second electrodes being representative of different ranges within said range of values.

2. The combination as set forth in claim 1 wherein said input amplifying device is a solid state amplifying device having a base, collector and emitter electrodes, said base electrode being coupled to said input terminal, said emitter electrode being coupled to said output terminal thereof.

3. The combination as set forth in claim 2 wherein each of said plurality of transistor means is a transistor having base, collector and emitter electrodes, said emitter electrode being connected to the terminal of a respective one of said potential divider networks, said base electrode being connected to said control electrode.

4. The combination as set forth in claim 3 wherein said collector terminal of said input amplifying device and said base terminal of each of said transistor means are coupled between a source of potential of no less magnitude than the value of the maximum input signal to be converted.

5. The combination as set forth in claim 1 further including integration means coupled between said input signal source and said input terminal for presenting to said terminal a signal which is time averaged.

6. A video display device including a display screen responsive to an input signal at various values for correspondingly displaying related levels of brightness on related portions of the screen and which screen includes at least a portion which is dark comprising in combination:
   means normally setting said input signal to a value corresponding to a screen level below the threshold of visibility;
   means responsive to said input signal being at a value corresponding to any level of brightness on said screen for producing a first signal which will cause said screen to rise to the threshold of visibility;
   means responsive to said input signal being at a value corresponding to any level of brightness on said screen for producing a second signal which when additively mixed with said first signal causes said screen to exhibit a brightness level which level is a function of the value of said input signal;
   additive mixing means responsive to said first and second signals for summing said signals and for applying the summed signal to said display screen for causing appropriate portions of said screen to exhibit various levels of brightness only when an input signal corresponding to some brightness level is present, other portions of said screen being dark.

7. The combination as set forth in claim 6 further including means for controlling the overall brightness of said screen comprising adjustable brightness control means coupled to said means for producing said second signal for scaling the value of said second signal as a function of the setting of said brightness control means.

8. The combination as set forth in claim 6 wherein said means producing said first signal comprises a transistor means having a principal conductive path between first and second electrodes, the conductivity of which is controlled responsive to potential appearing between said first electrode and a control electrode thereof and adjustable resistance means coupled to said first electrode, said second electrode being coupled to said additive mixing means, and further comprising means coupled between said first electrode and control electrode responsive to the value of said input signal for establishing signal flow only when said input signal is at value corresponding to any level of brightness, said adjustable resistance means being adjusted to provide signal flow to said additive mixing means from said second electrode which, in the absence of any other input signal to said additive mixing means, places said screen at the threshold of visibility.

9. The combination as set forth in claim 6 wherein said means producing said second signal comprises a transistor means having a principal conductive path between first and second electrodes, the conductivity of which is controlled responsive to potential appearing between said first electrode and a control electrode thereof and means coupled between said first electrode and said control electrode responsive to various values of input signal for providing various corresponding values of signal at said first electrode, said second electrode being coupled to said additive mixing means, said second electrode signal resulting from said first electrode signal mixed, when with said first signal, causing said screen to exhibit various levels of brightness in accordance with the values of said input signal.

10. The combination as set forth in claim 9 further including brightness control means comprising adjustable resistance means resistively coupling a source of potential to said control electrode for adjusting the amplification of said transistor means in accordance with the setting of said resistance means.

11. The combination as set forth in claim 10 further including integration means having a discharge terminal, said integration means being coupled to said adjustable resistance means for controlling the potential at said control electrode as a function of time and further including means coupled to said discharge terminal for periodically discharging said integration means.

12. A video display device having an input terminal for receiving input signals thereat and in accordance with the value of said signals for displaying at various points on the screen of said device, various levels of brightness and responsive to one input signal value for displaying a dark screen comprising in combination:
    means coupled to receive said input signals and responsive to all input signal values except said one input signal value for supplying to said input terminal a first signal of magnitude such that said screen is driven to the threshold of visibility above which said screen exhibits perceptible brightness;
    means also coupled to receive said input signals and responsive to all input signal values except said one input signal value for supplying to said input terminal a signal which is a function of the value of said input signal, the magnitude of which when combined with said first signal causes said screen to exhibit various levels of brightness as a function of said input signal value.

13. The combination as set forth in claim 12 wherein said means providing said first signal comprises a solid state amplification device having emitter, base and collector electrodes said collector electrode being coupled to said input terminal, and further including an adjustable resistance means coupled to said emitter electrode and decoder means coupled to said adjustable resistance means and responsive to said input signal being at other than said one value for causing current flow through said adjustable resistance means and through said emitter and collector electrodes, said adjustable resistance means being adjusted to a value such that in the absence of any other signal at said input terminal said display screen is driven to the threshold of visibility.

* * * * *